(12) United States Patent
Autumn et al.

(10) Patent No.: US 7,785,422 B2
(45) Date of Patent: Aug. 31, 2010

(54) SELF-CLEANING ADHESIVE STRUCTURE AND METHODS

(75) Inventors: Kellar Autumn, Portland, OR (US); Wendy R. Hansen, Berkeley, CA (US)

(73) Assignee: Lewis & Clark College, Portland, OR (US)

( * ) Notice: Subject to any disclaimer, the term of this patent is extended or adjusted under 35 U.S.C. 154(b) by 1211 days.

(21) Appl. No.: 11/030,752

(22) Filed: Jan. 5, 2005

(65) Prior Publication Data

US 2005/0151385 A1 Jul. 14, 2005

Related U.S. Application Data

(60) Provisional application No. 60/534,806, filed on Jan. 6, 2004, provisional application No. 60/534,554, filed on Jan. 5, 2004.

(51) Int. Cl.
*B08B 1/02* (2006.01)
(52) U.S. Cl. .............................. 134/32; 134/6; 294/86.4
(58) Field of Classification Search ........................ None
See application file for complete search history.

(56) References Cited

U.S. PATENT DOCUMENTS

| | | | |
|---|---|---|---|
| 4,545,831 A | | 10/1985 | Ornstein |
| 5,104,473 A | * | 4/1992 | Tveit et al. ................... 156/268 |
| 5,264,722 A | | 11/1993 | Tonucci et al. |
| 5,392,498 A | | 2/1995 | Goulait et al. |
| 5,802,864 A | | 9/1998 | Yarbrough et al. |
| 5,843,657 A | | 12/1998 | Liotta et al. |
| 5,843,767 A | | 12/1998 | Beattie |
| 5,951,931 A | | 9/1999 | Murasaki et al. |
| 5,959,200 A | | 9/1999 | Chui et al. |
| 6,393,327 B1 | | 5/2002 | Scribner |
| 6,413,156 B1 | * | 7/2002 | Shimizu et al. ............. 451/287 |

(Continued)

FOREIGN PATENT DOCUMENTS

DE 102 23 234 A1 12/2003

(Continued)

OTHER PUBLICATIONS

Hansen et al., *PNAS*, 102(2):385-389 (2005).

(Continued)

*Primary Examiner*—Michael Barr
*Assistant Examiner*—Eric Golightly
(74) *Attorney, Agent, or Firm*—Weaver Austin Villeneuve & Sampson LLP

(57) ABSTRACT

A method and apparatus for transporting an object from one workstation to another, where the object or workstations may be contaminated with unwanted dirt or dust particles, are disclosed. The object is gripped at one work station with a movable transfer arm. The movable transfer arm has an end effector including an array of nano-scale projections, where each projection provides one or more distal contact ends. The density of the contact ends is such as to grip a surface of the object with an intermolecular force sufficient to hold the object for movement After moving the gripped object to the workstation, the end effector is manipulated to release the gripped object. Before, during or after transport of the object, the arm's end effector is brought into contact with a cleaning surface.

6 Claims, 9 Drawing Sheets

U.S. PATENT DOCUMENTS

| | | | |
|---|---|---|---|
| 6,737,160 | B1 | 5/2004 | Full et al. |
| 7,011,723 | B2 | 3/2006 | Full et al. |
| 7,335,271 | B2 | 2/2008 | Autumn |
| 2001/0002594 | A1 | 6/2001 | Binkhoff |
| 2002/0106314 | A1* | 8/2002 | Pelrine et al. .............. 422/186 |
| 2003/0124312 | A1 | 7/2003 | Autumn |

FOREIGN PATENT DOCUMENTS

| | | |
|---|---|---|
| WO | WO 01/49776 A2 | 7/2001 |

OTHER PUBLICATIONS

Sitti et al., *Proceedings of the 2003 IEEE International Conference on Robotices and Automation ICRA 2003*, vol. 1 of 3, pp. 1164-1170.

Russell, "Contributing to the functional analysis of the foot of the Tokay Gekko gecko" Zoo. Lond. (1975).

Edwards, et al., "The adhesive pads of Heteroptera: a reexamination" Proc. R.ent. Socl. Lond. (1970).

Beni Charan Mehendra, Contributions to the Bionomics, Anatomy, Reproduction and Development of the Indian House-Gecko, Hemidactylus Flaviviridis Rupel, pp. 288-306, Dec. 19, 1940.

Rodolofo Ruibal et al., "The Structure of the Digital Setae of Lizards", Department of Life Sciences, University of California, Riverside, CA Journal of Morphology, 117: 271-293, Nov. 1965.

P.F.A. Maderson, "Keratinized Epidermal Derivatives as an Aid to Climbing in Gekkonid Lizards", vol. 203, pp. 780-781, Aug. 15, 1964.

Sunder Lal Hora, "The Adhesive Apparatus on the Toes of Certain Geckos and Tree-frogs" Journal of the Proceedings of the Asiatic Society 9:137 (1923).

E.E. Williams, "Convergent and Alternative Designs in the Digital Adhesive Pads of Scincid Lizards", Sciences, vol. 215, pp. 1509-1511, Mar. 19, 1982.

T. Thurn-Albrecht, J. Schotter, G.A. Kastle, N. Emley, T. Shibauchi, L. Krusin-Elbaum, K. Guarini, C.T. Black, M.T. Tuominen and T.P. Russell, "Ultrahigh-Density Nanowire Arrays Grown in Self-Assembled Diblock Copolymer Templates" Science Dec. 15, 2000; 290:2126-2129.

K. Autumn et al. "Adhesive Force of a Single Gecko Foot-Hair" Nature, vol. 405, pp. 681-685, 2000.

Y.A. Liang et al., "Adhesion Force Measurements on Single Gecko Setae" Technical Digest of the 2000 Solid-Setae Technical Digest of the 2000 Solid-State Sensor and Actuator Workshop, Hilton Head Island, SC (2000).

Stork, N.E. "Experimental analysis of adhesion of chrysolina polita (Chrysomelidae: Coleptera) on a variety of surfaces" Journal of Experimental Biology 88: 91-107 (1980).

Peterson, J.A. and E.E. Williams "A case study in retrograde evolution: the onca lineage in anoline lizards. II. Subdigital fine structure" Bulletin of the Museum of Comparative Zoology 149: 215-268 (1981).

Edwards J.S. "Observations on the development and predatory habit of two reduvid heteroptera, phinocoris carmelita stal and platymeris rhadamanthus gerst" Proc. R. Ent. Soc. Long.: 89-98 (1962).

Stork, N.E. (1978) A scanning electron microscope study of tarsal adhesive setae in the coleopteran Zoological Journal of the Linnean Society 68: 173-306.

U.S. Office Action dated Mar. 21, 2005 from U.S. Appl. No. 10/039,574.

U.S. Office Action dated Apr. 7, 2005 from U.S. Appl. No. 10/039,574.

U.S. Office Action dated Jul. 7, 2005 from U.S. Appl. No. 10/039,574.

U.S. Office Action dated Aug. 11, 2006 from U.S. Appl. No. 10/039,574.

U.S. Office Action dated Mar. 30, 2007 from U.S. Appl. No. 10/039,574.

Notice of Allowance dated Sep. 20, 2007 issued in U.S. Appl. No. 10/039,574 (7,335,271).

* cited by examiner $$W = \frac{-AR}{6D}$$

$$W = \frac{-A}{12\pi D^2} y^2 \quad W = \frac{-AR}{6D}$$

$$W = \frac{-A}{12\pi D^2} y^2 \quad W = \frac{-A}{12\pi D^2} \min(y,z)^2$$

SELF-CLEANING ADHESIVE STRUCTURE AND METHODS

This patent application claims priority to U.S. provisional patent application No. 60/534,806 filed on Jan. 6, 2004, and to U.S. provisional patent application No. 60/534,554 filed on Jan. 5, 2004, both of which are incorporated herein in their entirety by reference.

FIELD OF THE INVENTION

The present invention relates to self-cleaning adhesive structures, and in particular, to a self-cleaning method and apparatus for transporting objects from one workstation to another.

BACKGROUND OF THE INVENTION

Microfabrication and nanofabrication techniques often require movement of micro-scale or nano-scale objects from one workstation to another, or for manipulating the position of an object within a workstation, typically in a clean-room environment that must be relatively dust free. Given the small size of the objects being formed and the need for precision movement, it is often necessary to move or arrange such objects with a robotic arm. Accordingly, the robotic arm must be able to engage such objects, transfer them to a second workstation, often at a precise location and orientation, and release the object once properly placed.

There are several possible gripping mechanisms that might be employed by the robotic arm, including mechanical, magnetic, or adhesive-type gripping. Mechanical gripping suffers from the problem that many objects cannot be readily gripped mechanically, or only with a risk of damaging the object. Additionally, a mechanical gripping mechanism may require end-effector lubricant that has the potential for contaminating the clean-room environment. Magnetic gripping avoids both of these problems, but is useful, of course, only where the objects being manipulated have suitable magnetic. Adhesive gripping provides an attractive alternative to mechanical or magnetic gripping, assuming that the adhesive bond allows for easy release of the object and does not contaminate the object with adhesive material, e.g., tacky polymer material. Heretofore, the inventor has been involved in the development of a gripping system that employs mechanisms of adhesion in gecko footpad setae for use in gripping and transporting objects. See, for example, U.S. patent application U.S. 20030124312 A1, published Jul. 3, 2003, and incorporated herein by reference. Briefly, the gripping mechanism described in this application includes an array of gecko setae or artificially constructed setae that have essentially the same adhesive properties as the gecko foot pad. The array can form a strong adhesive bond to objects upon contact, allowing the objects to be gripped at one location and picked up and moved to another location. Once placed at its destination, the object can be released from the gripping head by angulating the head to "strip" the object away.

One limitation of the above system is that small particles, such as dust, are also picked up and transported by the gripping head, and this has the potential to contaminate the objects being moved.

It would therefore be desirable to provide a gripping-transporting mechanism that can be maintained in a substantially dust-free state during operation, thus avoiding problems of dust contamination in a setting, such as a clean room setting, where avoiding particle contamination is essential. It would also be desirable, for nanotechnology application, to provide a system that is capable of moving and placing nano-scale objects within a workstation.

SUMMARY OF THE INVENTION

The invention includes, in one aspect, a method for transporting an object from one workstation to another, or for manipulating an object within a workstation, where the object or workstations may be contaminated with unwanted dirt or dust particles. In practicing the method, the object is gripped at one workstation with an end effector composed of an array of nano-scale projections, where each projection provides one or more distal contact ends, the density of contact ends is such as to grip a surface of the object with an intermolecular force sufficient to hold the object for movement, and the relative sizes of the object and particles are such that the object makes contact with several fold, e.g., 3-10 times or greater, the number of contact ends than are in contact with such particles. The gripped object is moved within the workstation or to the other workstation and the end effector is manipulated to release the gripped object. At some time during or after the time of transfer, the end effector is contacted with a cleaning surface having a surface interaction energy with particles carried on the effector that is as great or greater than the surface interaction energy between particles and effector, thereby to transfer such particles to the cleaning surface.

Typically, the cleaning surface provides a greater area of contact with the unwanted particles than the end effector, although the greater surface interaction can be achieved, at least in part, by differences in the nature of the effector and transfer surface. The cleaning surface has a preferred surface roughness of less than about 100 nm $R_{RMS}$.

The contacting step in the method may include bringing the end effector into and out of contact with the cleaning surface N times, where N is calculated to effect transfer of a particle from the end effector to the cleaning surface with high probability. This step may be done, for example, by vibrating the end effector into and out of contact with the cleaning surface for a selected time that is calculated to effect transfer of a particle from the end effector to the cleaning surface with high probability.

The object may be released from the end effector by placing the object on the other workstation and rotating the end effector to peel the object away from the arm's gripping surface.

In another aspect, the invention includes apparatus for transporting an object from one workstation to another, or for manipulating an object within a workstation, where the object or workstations may be contaminated with unwanted dirt or dust particles. The device includes a movable transfer arm having an end effector composed of an array of nano-scale projections, where each projection provides one or more distal contact ends, the density of contact ends is such as to grip a surface of the object with an intermolecular force sufficient to hold the object for movement, and the relative sizes of the object and particles are such that the object makes contact with several fold, e.g., 3-10 times or greater, the number of contact ends than are in contact with such particles.

A cleaning surface in the apparatus is disposed within the area of movement of the transfer arm. This surface has a surface energy interaction with particles carried on the effector as great or greater than the surface energy interaction between particles and effector. A control unit in the apparatus is operatively connected to the arm for: (i) placing the arm's end effector in contact with such an object at one workstation;

thereby to grip the object; (ii) moving the arm and gripped object within the workstation or to the other workstation; (iii) manipulating the arm's end effector to release the gripped object, and (iv) bringing the arm's end effector into contact with the cleaning surface one or more times, to transfer unwanted dust particles on the gripping surface to the cleaning surface.

The end-effector projections may be individual seta or groups of setae, each composed of a setal stalk terminating at a distal end, where the setae are sufficiently flexible to adapt said array for non-planar contact with the object. In an exemplary embodiment, the setal stalks have a Young's modulus of 1 mega Pascal or greater, and the distal tips have a hydrophobicity, as measured by surface energy, of between 10-40 mJ/m$^2$. The setae may terminate at enlarged, rounded tips.

In a related embodiment, the end-effector projections include a individual or groups of spatular arrays, where each spatula is composed of a spatular stalk terminating at a distal end, where the spatulae are sufficiently flexible to adapt said array for non-planar contact with the object. In an exemplary embodiment, the spatular stalks have a Young's modulus of 1 mega Pascal or greater, and the distal tips have a hydrophobicity, as measured by a surface energy, of between 10-40 mJ/m$^2$. The spatulae may terminate at enlarged, rounded tips.

The projections, e.g., rounded projections, individual or groups of setae, or individual or groups of spatular arrays, may be formed, for example, from a polymer, silicon, a ceramic or inorganic carbon. Exemplary polymers include polyethylene, polypropylene, and polyurethane. The projections may have a substantially hemispherical contact end or surface.

The cleaning surface in the apparatus may have a greater area of contact with the unwanted particles than the end effector, and may have a surface roughness of less than about 100 nm $R_{RMS}$.

For use in transporting an object having a contact area $A_o$ which is in a defined size range greater than about 5,000 nm$^2$, and for self-cleaning unwanted particles having a contact area $A_p$ in a defined size range between about 100 and 6400 nm$^2$, and less than about $0.1A_o$, the projections may terminate at a hemispherical distal tip having a selected radial dimension R between about 5 and 2,000 nm, and where: (i) $A_p \geq 2\pi nm \times R$, (ii) the spacing between adjacent projections is such that an unwanted particle makes contact on average several fold times fewer projections than does the object; and (iii) the projections are formed of a material having a surface energy of between about 10-40 mJ/m$^2$. The radial dimension R and corresponding areal dimensions $A_o$ and $A_p$ may be selected from the group:

(i) when $R \geq 5$ nm, $A_p \geq 80$ nm$^2$, and $A_o \geq 800$ nm$^2$;
(ii) when $R \geq 25$ nm, $A_p \geq 200$ nm$^2$, and $A_o \geq 2,000$ nm$^2$;
(iii) when $R \geq 50$ nm, $A_p \geq 400$ nm$^2$, and $A_o \geq 4,000$ nm$^2$;
(iv) when $R \geq 100$ nm, $A_p \geq 650$ nm$^2$, and $A_o \geq 6,500$ nm$^2$;
(v) when $R \geq 250$ nm, $A_p \geq 1,600$ nm$^2$, and $A_o \geq 16,000$ nm2;
(vi) when $R \geq 500$ nm, $A_p \geq 3,200$ nm$^2$, and $A_o \geq 32,000$ nm2;
(vii) when $R \geq 1,000$ nm, $A_p \geq 6,300$ nm$^2$, and $A_o \geq 63,000$ nm2;
(viii) when $R \geq 1,500$ nm, $A_p \geq 9,500$ nm$^2$, and $A_o \geq 95,000$ nm2;
(ix) when $R \geq 2,000$ nm, $A_p \geq 12,600$ nm$^2$, and $A_o \geq 126,000$ nm2;

The control unit may operate to carry out step (iv) by bringing the arm's gripping surface into and out of contact with the cleaning surface N times, where N is calculated to effect transfer of a particle from the arm's gripping surface to the cleaning surface with high probability. The control unit may operate to carry out step (iv) by vibrating the arm's gripping surface into and out of contact with the cleaning surface for a selected time which is calculated to effect transfer of a particle from the arm's gripping surface to the cleaning surface with high probability. The control unit may operate to carry out step (iii) by (iiia) placing the object on said other workstation and (iiib) rotating the end effector to peel the object away from the arm's gripping surface.

In another aspect, the invention includes an apparatus for fabricating a nano- or micro-device, by placing at selected locations on a substrate, a plurality of discrete elements each having a substantially planar surface facet or plane whose area $A_e$ is in a defined size range between about 100 and 6400 nm$^2$. The apparatus includes (a) a movable transport arm having an end effector composed of a nanoscale projection having a selected dimension R between about 5 and 2,000 nm, and where $A_e \geq 2\pi nm \times R$, and the projection is formed of a material having a surface energy at least 10 mJ/m$^2$, and preferably 10-40 mJ/m$^2$ (b) a pickup station at which the elements are held, and (c) a workstation for holding the substrate. A preferred projection is rounded, e.g., hemispherical in shape.

A control unit in the apparatus is operatively connected to the transport arm for: (i) placing the arm's projection surface in contact with a selected element at the pickup station, thereby to grip an element, (ii) moving the arm and gripped element to the workstation; (iii) placing the gripped element against a surface portion on the structure, where such structure has a greater surface interaction energy with the element than does the projection; and (iv) repeating steps (i)-(iii) to place the plurality of elements on the structure.

The portion of the structure against which the element is placed preferably provides a greater area of contact with the gripped element than does a rounded end-effector projection. The structure portion may be formed of a material, and has a surface roughness of less than about 100 nm $R_{RMS}$. Exemplary radial dimensions R and corresponding areal dimensions $A_e$ are:

(i) when $R \geq 5$ nm, $A_e \geq 80$ nm$^2$,
(ii) when $R \geq 25$ nm, $A_e \geq 200$ nm$^2$,
(iii) when $R \geq 50$ nm, $A_e \geq 400$ nm$^2$,
(iv) when $R \geq 100$ nm, $A_e \geq 650$ nm$^2$,
(v) when $R \geq 250$ nm, $A_e \geq 1,600$ nm$^2$,
(vi) when $R \geq 500$ nm, $A_e \geq 3,200$ nm$^2$
(vii) when $R \geq 1,000$ nm, $A_e \geq 6,300$ nm$^2$,
(viii) when $R \geq 1,500$ nm, $A_e \geq 9,500$ nm$^2$, and
(ix) when $R \geq 2,000$ nm, $A_e \geq 12,600$ nm$^2$, The apparatus may be designed for placing two or more such element simultaneously on such structure. Here the end effector provides two or more such projections that are arranged to place different gripped elements on different portions of the structure simultaneously. In one embodiment, for use in transferring a pattern of such elements onto the surface of a substrate, to form a pattern of such particles on the substrate, the end effector includes an array of rounded projections in the shape of the pattern.

In yet another aspect, the invention includes an adhesive structure capable of (i) adhering to an object having a contact area $A_o$ which is in a defined size range greater than about 5,000 nm$^2$, and (ii) self-cleaning an unwanted particle having a contact area $A_p$ in a defined size range between about 100 and 6400 nm$^2$, and less than about $0.1A_o$. The structure includes a (a) a support, and (b) formed on the support, an array of rounded nanoscale projections, each having a selected radial dimension R between about 5 and 2,000 nm, where (i) $A_p \geq 2\pi nm \times R$, where the relative sizes of the object and particles are such that the object makes contact with several-fold times of the number of projections contacted by such particles, and (iii) the projections are formed of a material having a surface energy of at least 10, typically 10-40 mJ/m$^2$.

Exemplary radial dimension R and corresponding areal dimensions $A_o$ and $A_p$ are:
  (i) when $R \geq 5$ nm, $A_p \geq 80$ nm$^2$, and $A_o \geq 800$ nm$^2$;
  (ii) when $R \geq 25$ nm, $A_p \geq 200$ nm$^2$, and $A_o \geq 2,000$ nm$^2$;
  (iii) when $R \geq 50$ nm, $A_p \geq 400$ nm$^2$, and $A_o \geq 4,000$ nm$^2$;
  (iv) when $R \geq 100$ nm, $A_p \geq 650$ nm$^2$, and $A_o \geq 6,500$ nm$^2$;
  (v) when $R \geq 250$ nm, $A_p \geq 1,600$ nm$^2$, and $A_o \geq 16,000$ nm2;
  (vi) when $R \geq 500$ nm, $A_p \geq 3,200$ nm$^2$, and $A_o \geq 32,000$ nm2;
  (vii) when $R \geq 1,000$ nm, $A_p \geq 6,300$ nm$^2$, and $A_o \geq 63,000$ nm2;
  (viii) when $R \geq 1,500$ nm, $A_p \geq 9,500$ nm$^2$, and $A_o \geq 95,000$ nm2;
  (ix) when $R \geq 2,000$ nm, $A_p \geq 12,600$ nm$^2$, and $A_o \geq 126,000$ nm2;

The peak-to-peak spacing between adjacent projections may be greater than R, and the end-effector projections may have a substantially hemispherical contact surface. The projections, e.g., rounded projections, setae, or spatulae, may be formed of a polymer, silicon, a ceramic or inorganic carbon. Exemplary polymers include polyethylene, polypropylene, and polyurethane. The projections may have a substantially hemispherical contact surface.

The structure may be in the form of an adhesive tape, where the support is formed by a tape backing. The projection array may include an array of setae attached to the support where (i) each seta provides an array of spatular structures composed of shafts terminating at distal-end spatular projections, and (ii) each spatula forms a projection in an array. For use in adhering an object whose contact area is substantially non-planar, the setae may be sufficiently flexible to adapt the non-planar contact with said object.

These and other objects and features of the invention will be more fully appreciated when the following detailed description of the invention is read in conjunction with the accompanying drawings.

DETAILED DESCRIPTION OF THE INVENTION

I. Definitions

Figure 1:
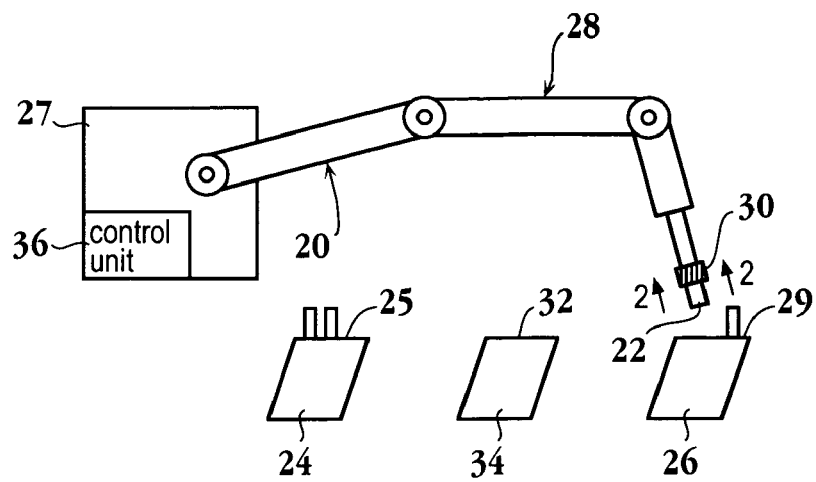
FIG. 1 shows a self-cleaning transport device constructed in accordance with one embodiment of the invention.

A "nanoscale projection" refers to a raised projection having a radial or side dimension typically in the range between 5 and 2,000 nm.

A "rounded projection" refers to a projection, e.g., nanoscale projection, having a rounded exterior shape, e.g., hemispherical or hemi cylindrical.

A projection, including a rounded projection, may be formed as a simple geometric shape, e.g., hemispherical or hemicylindrical shape, or may be formed of an individual seta or group of setae, i.e., a bristle like structures formed of a stalk termination at a distal contact end or tip, or individual or groups of spatular arrays, where each spatula in the array has a stalk terminating at a distal contact end or tip, and a hierarchical setal structure having a setal stalk terminating at a array spatulae.

A "spatula" denotes a splitting of an elongate surface into two parts, a stalk and a distal-end tip or end. The distal-end tip may be enlarged and have one of a variety of shapes, e.g., circular, triangular, or cupped. The two-parts of the spatula give it flexibility, and therefore allow for more intimate contact of the distal-end tip with a object.

A "seta" refers to a shaft that bears one or more spatula, or which itself terminates at a distal contact end. Shafts are usually angled with respect to the surface, so they can act as leaf springs.

"Setal array" is an array of setae of a particular size, shape, and orientation. A setal array may be mounted on a flexible beam, or simply on a compliant substrate, such as a polymer pad, with an effective young's modulus of 50-500 mPa.

"Intermolecular force" refers to the sum of all intermolecular forces between two objects in contact, including ionic and Van der Waals interactions.

"Surface interaction energy" refers to the sum of all intermolecular forces, including Van der Waals interactions, between two bodies at their area of surface-to-surface contact. "Surface energy" is approximately one-half of the surface interaction energy. Both are typically measured in mJ/m$^2$.

"Van der Waals interactions" refers to the attractive force's between atoms or molecules other than electrostatic (ionic), covalent (sharing of electrons), or hydrogen bonding (sharing a proton); generally ascribed to dipolar and dispersion effects, π -electrons, etc.; these relatively nondescript force's contribute to the mutual attraction of organic molecules.

"Surface roughness" is measured by special precision instruments that measure the vertical deviations when traversing the metal surface. Ra is the most commonly used parameter to describe the average surface roughness and is defined as an integral of the absolute value of the roughness profile measured over an evaluation length:

$$Ra = \frac{1}{l}\int_0^l |z(x)|dx$$

The average roughness is the total area of the peaks and valleys divided by the evaluation length, it is expressed in μm (thousand of a millimeter). The total area of the peaks above the mean line should be equal to the total area of the valleys below the mean line. Centre line average (CLA) and arithmetic average (AA) are older designations for average surface roughness.

II. Self-Cleaning Transport Apparatus

FIG. 1 illustrates an apparatus 20 for transporting an object, such as object 22, from a first workstation 24 having a working surface 25 to a second workstation 26 having a working surface 29, or for manipulating the position of an object within a single workstation. Typically, the one or more workstations are contained within a clean-room environment devoted to micro- or nano-fabrication operations, and the objects being moved are micro- or nano-fabricated structures, such as semiconductor wafers or chips, being processed, or small molecular units being moved between workstations or manipulated within a workstation.

Apparatus 20 generally includes a robotic device 27 having a movable transfer arm 28 terminating at an end effector 30, which is the structure that does the gripping in the device. As will be detailed further below with respect to FIGS. 2-7, the end effector is formed of an array of nanoscale projections, described below, where each projection is formed of a material and is sized and spaced to grip a surface of the object with an intermolecular force sufficient to hold the object for movement, and where the relative sizes of the object and particles are such that the object makes contact with several-fold, e.g., 3-10 times or greater, the number of projections contacted by such particles.

A cleaning structure 34 in the apparatus defines an upper cleaning surface 32 disposed within the area of movement of arm 28. As will be described in greater detail below, the cleaning surface preferably has a low surface roughness, $R_a$, preferably less than about 100 nm$_{RMS}$, and in particular, is intended to provide a surface interaction with contaminating particles carried on the effector that is as great as, and preferably greater than the surface interaction between the particles and effector. Preferred materials forming the cleaning surface include a polymer, silicon, and a ceramic or inorganic carbon. Exemplary polymers are polyethylene, polypropylene, polyurethane, teflon, and silicone rubber. Although not shown here, the apparatus may include a vacuum, electrostatic, or other particle-removal device for removing particles transferred to the cleaning surface.

A control unit 36 in device 27 operates to control the movement of arm 28 during a transfer operation. This process involves (i) placing the arm's end effector in contact with an object at one workstation; (ii) moving the arm and gripped object to the other workstation or manipulating the arm within the first workstation, (iii) manipulating the arm's end effector to release the gripped object, and (iv) bringing the arm's end effector into contact with the cleaning surface one or more times, to transfer unwanted dust particles on the gripping surface to the cleaning surface. The last-mentioned particle cleaning step may be performed before or after each transfer or manipulation step, or may be performed less often, depending on the observed accumulation of contaminating particles on the end effector. In one embodiment, the end-effector is vibrated against the cleaning surface to create rapid multiple contacts.

Figure 2A:
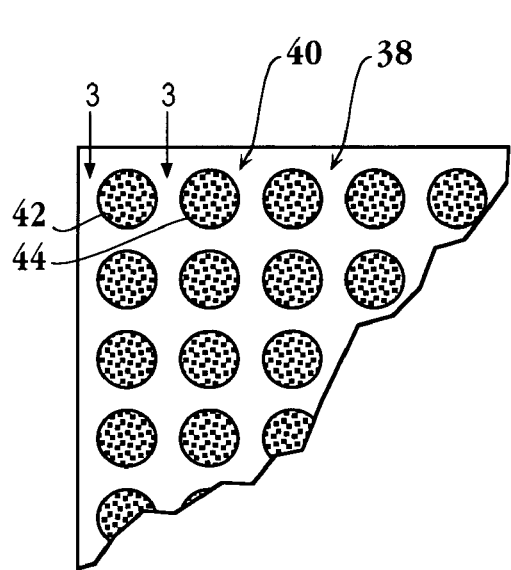
FIGS. 2A and 2B are plan views of portions of the effector head, as viewed along line 2-2 in FIG. 1, for a setae embodiment of the invention in which the effector is formed of an array of setae (2A), and a tape embodiment in which the effector head is formed of an array of rounded projections (2B)
Figure 2B:
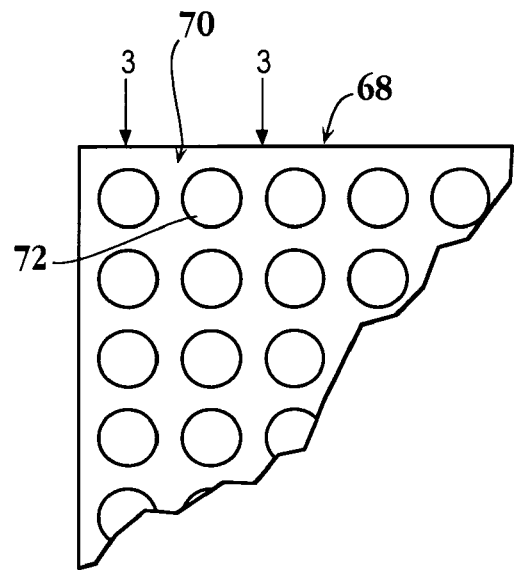

FIGS. 2A and 2B illustrate two different end-effector constructions in accordance with the invention, both structures seen along the view line 2-2 in FIG. 1. Structure 38 seen in FIG. 2A shows an array 40 of projections, such as projections 42, 44, where each projection is composed of an array individual seta, or an array of individual groups or spatulae, such as described below with reference to FIGS. 3A-3D. One embodiment of the end-effector structure shown in FIG. 2A is illustrated in enlarged view in FIG. 5, which shows a portion of a projection 44 in the array, and a plurality of curved structures 43 forming the projection, where each structure defines a contact end for contacting a workpiece.

Figure 3A:
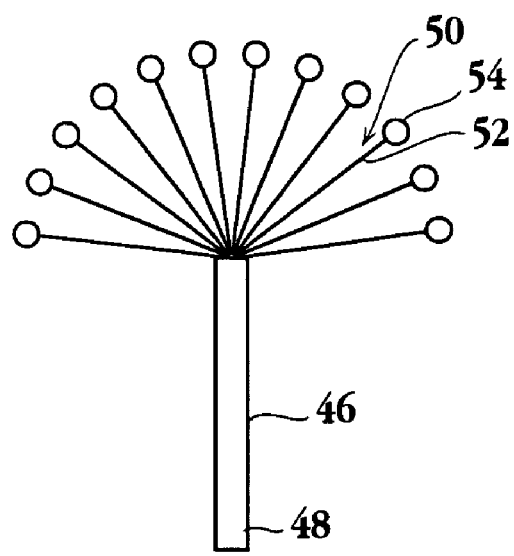
FIGS. 3A-3D are an enlarged side view of a spatula array type projection (3A) in the effector head of the embodiment formed in accordance with FIG. 2A, and various spatula geometries (3B-3D) that may be used alone (seta) or in a spatula array of the type shown in FIG. 3A.

FIG. 3A shows a plurality of spatulae 50, where each spatula includes a stalk 52 and a distal contact end or tip 54, and the proximal end of the spatulae are anchored to a setal stalk 46 having a proximal end region 48 by which the stalk is anchored to the end effector. The structure shown in FIG. 3A may form a single projection in the effector, as in FIG. 2B, or each projection may be formed of an array of such structures, as in FIG. 2A. The tip of the spatula provides the area of surface contact with an object being transported. Adhesion is produced as the spatula or array of spatulae produce intimate contact with a surface. A seta may have relatively few, e.g., 5-10 spatulae, or carry many, e.g., 100 or more spatulae. The setal structure shown in FIG. 3A is like one described in the above-cited U.S. patent application U.S. 20030124312 A1. As noted there, a spatula shaft may have a length of less than about 500 microns, typically between about between about 10 and 100 microns, and a diameter between about 0.01 and 0.1 times the length of the shaft, typically about 0.05 times the length of the shaft. The flexible setal shaft or beam has a length of between 1 and 5 centimeters, a width of between about 0.5 and 1 centimeter, and a thickness of between about 0.1 and 0.3 millimeters. The flexible beam produces between about 0.01 and 0.10 grams of a preload force while maintaining a substantially parallel alignment of the protrusions with a surface.

Figure 3B:
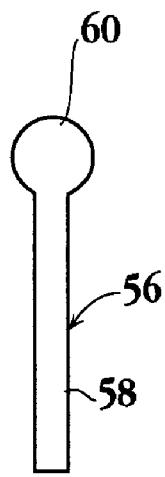
Figure 3C:
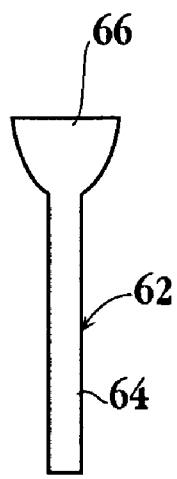
Figure 3D:
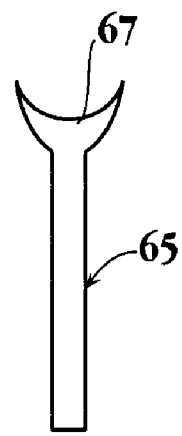

FIGS. 3B-3D show spatula structures that could either be used in the array structure shown in FIG. 3A or by themselves, in an array of single setae, each forming a single-seta projection. Structure 56 in FIG. 3B includes a stalk 58 terminating at a rounded distal tip 60. Structure 62 in FIG. 3C is formed of a stalk 64 terminating at a triangular-shaped distal-end enlargement 66. Structure 65 in FIG. 3D includes a stalk terminating at a tip 67 with a concave contact surface. A variety of other spatular shapes are suitable, including a cupped-shape tip, or simple stalk extension (non-enlarged tip).

Although the setal and/or spatular structures forming the gripping arrays may be formed of a variety of materials and have a variety of dimensions and shapes, there are certain constraints imposed by the requirement for supporting a workpiece or object and self-cleaning. First, the spacing and density of contacting ends or tips is such that the array makes contact with many, e.g., 50-10,000 or more array ends, to produce a sufficient gripping force between the end effector and workpiece being moved. This gripping force, in turn, is optimized when the gripping ends are relatively hydrophobic, as measured by a surface energy of between 10-40 mJ/m$^2$, preferably 10-25 mJ/m$^2$. Finally, the setal and/or spatular structures supporting the contact ends must be relatively stiff, as measured by a Young's modulus of at least 1 megaPascal or greater. If the material, e.g., stalks forming the projections are too pliable, they will tend to deform around unwanted particles, making self-cleaning inefficient. If too stiff, the projections will not be able to accommodate surface irregularities in the workpiece being moved, and the griping force exerted by the end effector may suffer from poor overall between the contact ends and workpiece.

Figures 4A, 4B, 4C:
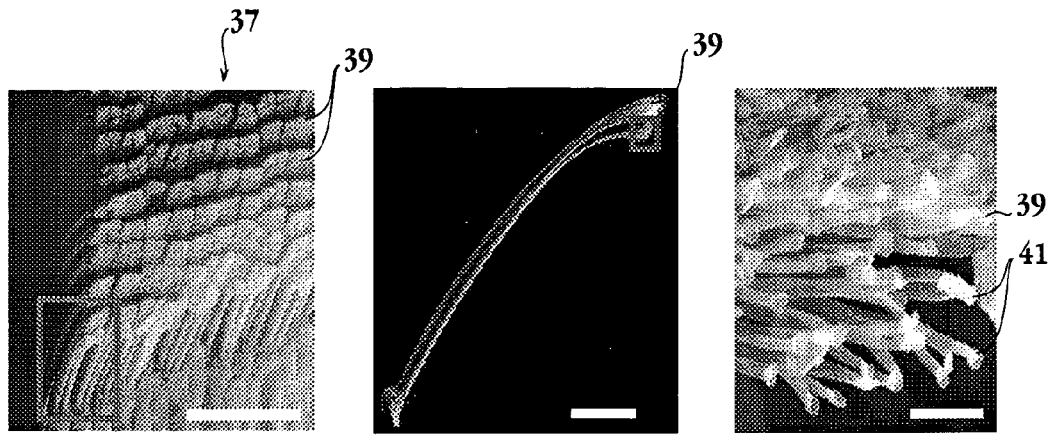
FIGS. 4A-4C show a natural gecko setal array (4A), an individual seta (4C), and an arrangement of spatula forming a seta (4C)
Figure 5:
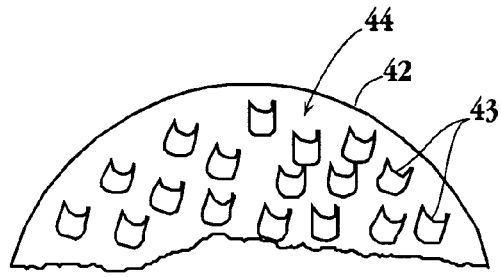
FIG. 5 is an enlarged plan view of an array of spatulae formed on a projection, such as in the array shown in FIG. 2A.

FIGS. 4A-4C illustrate the hierarchical construction of a gripping array in the tokay gecko, which serves as one model for a self-cleaning gripping array in the invention, and also one embodiment. As seen in FIG. 4A, setae 39 occur in uniform arrays 37 on overlapping lamellar pads, which have a density of about 14,400 mm$^{-2}$. Each seta 39 (FIG. 4B) is approximately 110 μm in length and 5 μm in diameter and branches at the tip into 100-1000 spatulae 41, which are approximately 0.2 μm in length and maximal width (FIG. 4C.). Gecko setal arrays can be isolated without harm to the animal, e.g., from live, restrained, non-molting tokay geckos, and the arrays can be bonded to a suitable carrier or substrate, e.g., acetate strips (¼"×1.0"×0.08") with cyanoacrylate gel.

More generally, the projection arrays described above can be formed by a variety of methods known to those skilled in the art, such as various surface patterning methods and microfabrication methods. For example, the devices may be fabricated through an oxide/nitride process, as described with respect to in FIGS. 5A-5C in the U.S. 20030124312 A1 application, incorporated herein by reference. Another technique that may be utilized in accordance with the invention exploits an excitation source, as described with respect to FIGS. 6A and 6B of the U.S. 20030124312 A1 application. Still another technique is that described with respect to FIG. 7 of the U.S. 20030124312 A1 application. This approach relies on the deposition of an etchable material on a substrate. Stalks are then patterned and etched from the etchable material. The etched substrate may be coated with oxide and/or nitride layers. Alternately, polymer layers may be used as a coating. The polymer layers may be spin-cast, using materials, such as photoresist, polyimide, glass, or epoxy-based compounds. The resultant stalks are then seeded to form nanotubes 136, operating as spatulae.

Artificial spatulae may be formed using a glass micropipette drawn down to a narrow aperture (e.g., 500 nm) at an end. Liquid polymer is extruded through the hollow pipette and is then cured. Surface tension creates a hemispherical drop at the end of the pipette, as illustrated and described with respect to FIG. 8 of the U.S. 20030124312 A1 application. Materials that can be applied to the micro-pipette include low viscosity ultra violet cure epoxy, uncured silicone rubber, or polyurethane resin. The hemisphere at the end of the micro-pipette can be flattened or embossed by pressing against a polished surface. A flattened surface, such as the paddle structure of FIG. 3C, with its larger contact area, has better adhesive properties than a sphere.

Spatulae may also be formed by lithographically induced self construction. With this technique, electrostatic attraction is used to pull liquid through a mask, and thereby "sprout" spatulae. This process is described in connection with FIGS. 10A-10D of the U.S. 20030124312 A1 application. Stalks and spatulae enlargements may also be formed from a mold using a nano-imprinting roller, as described with respect to FIGS. 11A-11B of the U.S. 20030124312 A1 application. FIG. 12 of the U.S. 20030124312 A1 application illustrates that a 2-layer photoresist can be formed with different resist exposure sensitivities, so that the upper layer forms, for example, 100 nm square plates that are supported by much longer and thinner pedestals. Standing-wave interference patterns can be used to expose and pattern features to fabricate large area arrays. Similar structures can be made with SiOx layers on silicon substrates by plasma etching.

Setae shafts may be fabricated using a sandwich of polymer layers. A polymer layer can include spin-cast polymer materials, such as photoresist, polyimide, glass, or epoxy-based compounds. A polymer layer can also include spray-deposited polymer materials, such as photoresist, polyimide, glass, or epoxy-based compounds. Alternately, a polymer layer may be an ultra-violet curable epoxy.

Figure 6:
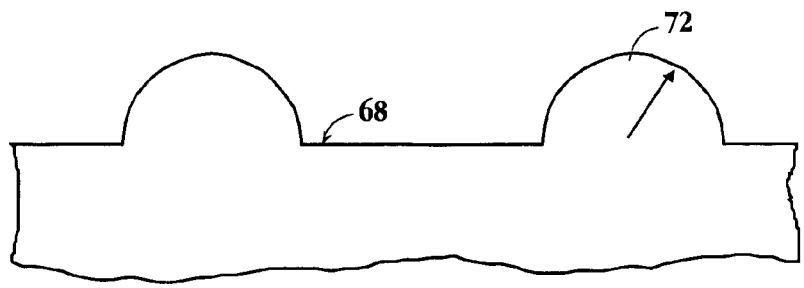
FIG. 6 is an enlarged sectional view taken along line 6-6 in FIG. 2B.

As seen in the enlarged sectional view in FIG. 6, the projections in an end-effector array, such as that shown in FIG. 2B, may be rounded projections defined by a spherical radius R. As shown in this figure, the projections may be separated from adjacent projections by a distance of at least R, and this separation distance may be (as is the case in FIG. 6) greater than 2R. As noted above, R typically has a selected value between 5 nm and 2,000 nm, i.e., 2 microns. In this structure, each projection has a single rounded contact end. FIG. 2B shows a portion of an end-effector structure 68 having an array 70 or hemispherical projections, such as projection 72. As seen in the enlarged sectional view in FIG. 6, the projections are defined by a spherical radius R. As seen best in FIG. 6, the projections are separated from adjacent projections by a distance of at least R, and this separation distance may be (as is the case in FIG. 6) greater than 2R. As noted above, R typically has a selected value between 5 nm and 2,000 nm, i.e., 2 microns. In this structure, each projection has a single rounded contact end. Structure 68 may be formed by a variety of polymer molded-polymer or surface treatment methods, e.g., photomask etching methods, laser etching, and the like. The structure, and particularly the projections thereof, may be formed from a polymer, silicon, a ceramic or inorganic carbon. Exemplary polymers are polyethylene, polypropylene, and polyurethane. Preferably the tape backing is sufficiently flexible to accommodate to different shapes the structure is in contact with.

Figure 7A:
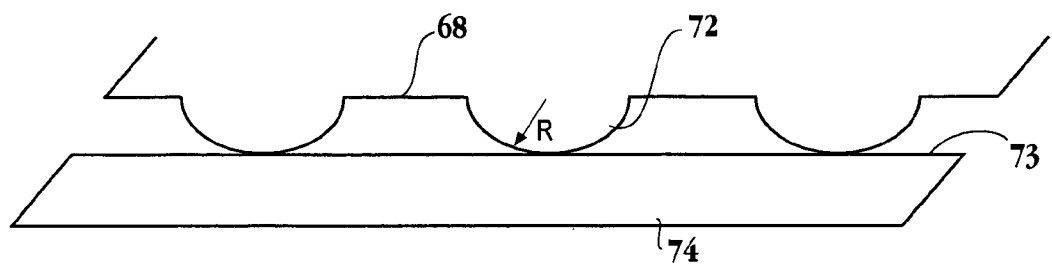
FIGS. 7A-7C are enlarged side sectional views of gripping interactions between an effector surface in accordance with the embodiment in FIG. 2B and an object to be transported (7A), and with flat (7B) or rounded (7C) particles, with FIGS. 7B and 7C also showing a cleaning surface on which the particles will be transferred, in accordance with the invention.
Figure 7B:
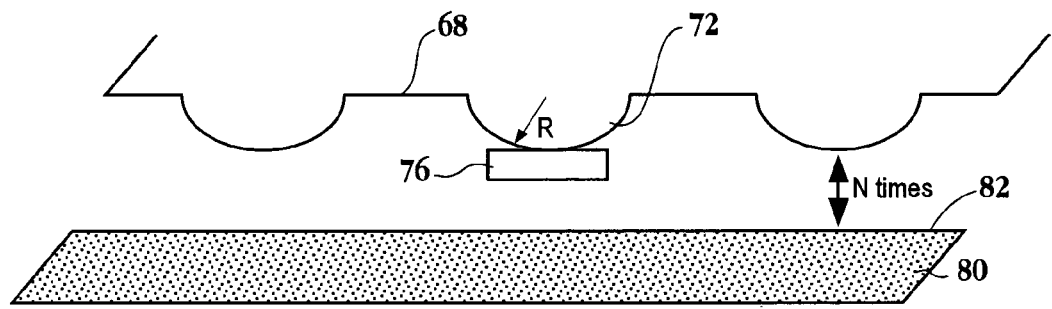
Figure 7C:
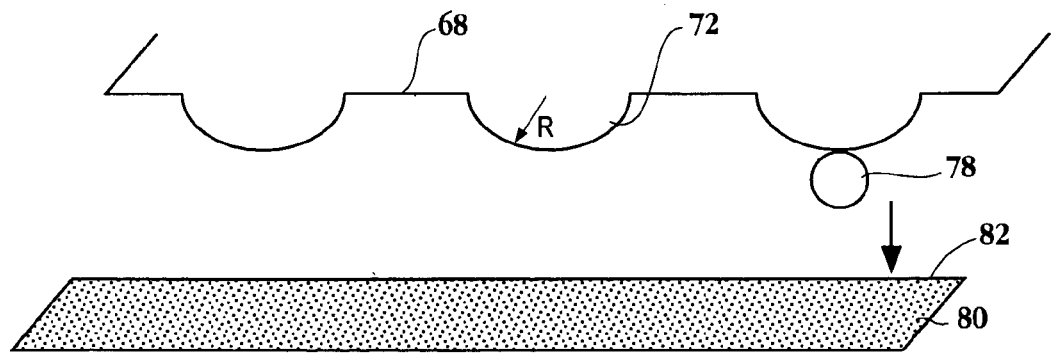

FIGS. 7A-7C illustrate the surface interactions that allow the end effector to pick up and grip relatively large objects to be moved, but readily shed small contaminating particles. For purposes of simplicity, the surface-interaction phenomena discussed in relation to the end effector having an array of simple hemispherical projections. However, it will be apparent that the same phenomena apply to the structurally more complex arrays illustrated in FIGS. 2A and 3-5, where projection in the end-effector array is itself formed of an array of individual setae or where each seta is itself formed of an array of spatulae.

FIG. 7A shows a portion of end-effector 68 in contact with a flat surface portion 73 of an object 74 to be moved. The critical interaction here is that the surface of the object makes contact with a plurality of array projections, such as projection 70, given a combined surface interaction between the end-effector and object that is a function of N, the total number array projections in contact with the object. As has been noted, the Van der Walls force between each projection and object may be as high as 60-80 mJ/m², where m² is the total area of contact between the end effector and object. Obviously, where each array projection is itself formed of an array of setae, each projections will engage the object at a large number of setae spatula ends. For relatively modest size end-effectors, the total; surface interaction energy may be sufficient to move objects of up to 1 kg.

In FIG. 7B, a small rectangular particle 76 has attached itself to projection 72 in the array, through surface interactions between the particle and projection. Also shown is the surface 82 of a cleaning region 80 at which the particle is to be deposited, by contacting the particles against the cleaning region. As will be analyzed in more detail below, the Van der Waals interaction between the projection and particle is less than that between the particle and cleaning surface for all $y^2 > 2\pi R$, where y is as indicated in the figure, assuming a relatively smooth area of contact between the particles and cleaning surface. In order to dislodge the particle from the end effector, the latter is brought into contact with cleaning surface 82 one or more (N) times, where N is calculated to produce a transfer of the particle onto the cleaning surface with a given probability, e.g., greater than 95%. Depending on the relative sizes and shapes of the particles and end-effector projections, N is typically 1 to 10.

FIG. 7C illustrates a similar self-cleaning phenomenon, but this time involving a small rounded particle 78. As will be seen below, transfer of rounded particles, e.g., spherical particles, from a rounded projection onto a flat cleaning surface occurs efficiently for all projection R and particle radii, and will typically require only a single contact between the end effector and the cleaning surface.

In one general embodiment of the invention, the apparatus is designed for use in transporting an object having a contact area $A_o$ which is in a defined size range greater than about 5,000 nm², and for self-cleaning unwanted particles having a contact area $A_p$ in a defined size range between about 100 and 6400 nm², and less than about $0.1 A_o$. That is, the contact area between the object to be moved and the end effector projections is at least about 10 times that between the end effector and a particle, and thus will involve contact between at least 10 times the number of contacting ends in the end effector.

The foregoing considerations are considered more systematically in the four illustrations 8A-8D, showing various combinations of flat or rounded projections interacting with rounded or rectangular particles. The Van der Walls energies W between the particles and cleaning surface and between the particles and projection are calculated according to Israelachvili, 1992. In the configuration shown in FIG. 8A, a rounded projection 86 of radius R interacts with a relatively large spherical particle 88 of radius r or a relatively small spherical particle 90 of radius r'. From the Van der Waals interaction forces given in the figure, it is seen that self-cleaning (particle transfer) is achieved efficiently (faster than geometric progression) for all R and r.

When the same rounded projection interacts with square particles 92 of side dimension y (FIG. 8C), self cleaning is energetically favorable only when $y^2 > 2\pi R$. Thus, cleaning occurs (although perhaps requiring multiple contacts) for larger particles, such as particle 92, but is not effective for quite small, flat-surfaced particles, such as particle 94 that fails to meet the above side-dimension condition.

Figure 8A:
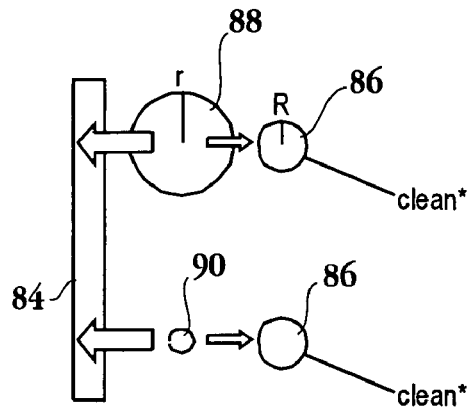
FIGS. 8A-8D illustrate particle transfer energetics involved in transferring relatively large and small particles from an effector head projection to a cleaning surface, where both the projection and particles have rounded surfaces (8A), the projection head has a rounded surface, and the particles, flat surfaces, the projection has a flat surface, and the particles, rounded surfaces (8C), and both the projection and particles have flat surfaces.
Figure 8B:
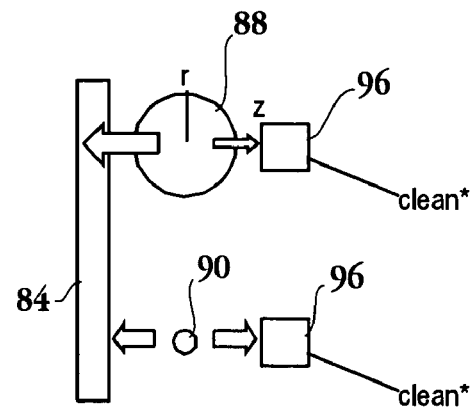
Figure 8C:
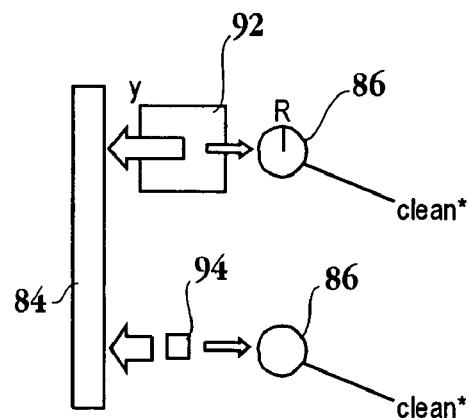
Figure 8D:
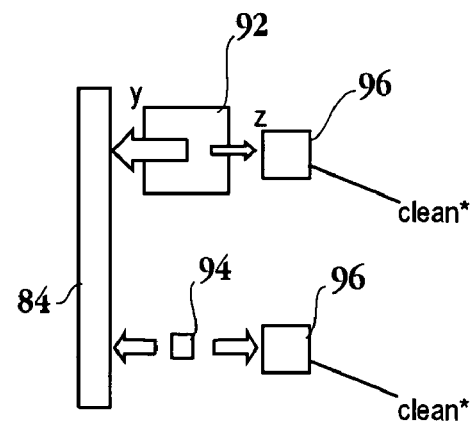

The situation with a rectangular projection 96 interacting with round and square particles is illustrated in FIGS. 8B and 8D, respectively. In the FIG. 8B configuration, surface interactions between the projection and cleaning surface 84 are equivalent for small spherical particles, thus requiring multiple contacts for efficient transfer. With larger-diameter particles, transfer from the projection to the cleaning surface occurs with high efficiency. The same analysis obtains when a square projection interacts with square particles 96, as shown in FIG. 8D. As seen here, particle transfer is efficient when y>z, and roughly equivalent when y<z.

More generally, in the embodiment noted above for transporting an object having a contact area $A_o$ which is in a defined size range greater than about 5,000 nm², and for self-cleaning unwanted particles having a contact area $A_p$ in a defined size range between about 100 and 6400 nm², the projections in the array of rounded nanoscale projections have a selected radial dimension R between about 5 and 2,000 nm, where (i) $A_p \geq 2\pi nm \times R$, (ii) the spacing between adjacent projections is such that an unwanted particle makes contact on average with one projection only, and the object to which the structure is intended to adhere makes contact on average with a plurality of the projections, and (iii) the projections are formed of a material having a surface energy of at least 10 mJ/m², more preferably 10-40 mJ/m² and most preferably, 10-25 mJ/m² or greater.

The foregoing provides a basis for determining, for any given radial dimension R in the end effector array, the sizes of objects that can be moved and particles that can be self-cleaned, where the object and particle sizes are represented as $A_o$ (the areal dimension of a surface of the object) and $A_p$ (the areal dimension of the surface of a particle). These values are:

(i) when $R \geq 5$ nm, $A_p \geq 80$ nm², and $A_o \geq 800$ nm²;
(ii) when $R \geq 25$ nm, $A_p \geq 200$ nm², and $A_o \geq 2,000$ nm²;
(iii) when $R \geq 50$ nm, $A_p \geq 400$ nm², and $A_o \geq 4,000$ nm²;
(iv) when $R \geq 100$ nm, $A_p \geq 650$ nm², and $A_o \geq 6,500$ nm²;
(v) when $R \geq 250$ nm, $A_p \geq 1,600$ nm², and $A_o \geq 16,000$ nm2;
(vi) when $R \geq 500$ nm, $A_p \geq 3,200$ nm², and $A_o \geq 32,000$ nm2;
(vii) when $R \geq 1,000$ nm, $A_p \geq 6,300$ nm², and $A_o \geq 63,000$ nm2;
(viii) when $R \geq 1,500$ nm, $A_p \geq 9,500$ nm², and $A_o \geq 95,000$ nm2;
(ix) when $R \geq 2,000$ nm, $A_p \geq 12,600$ nm², and $A_o \geq 126,000$ nm2;

As noted above, the peak-to-peak spacing between adjacent projections is greater than R, and the projections have a substantially hemispherical contact surface.

Figure 9:
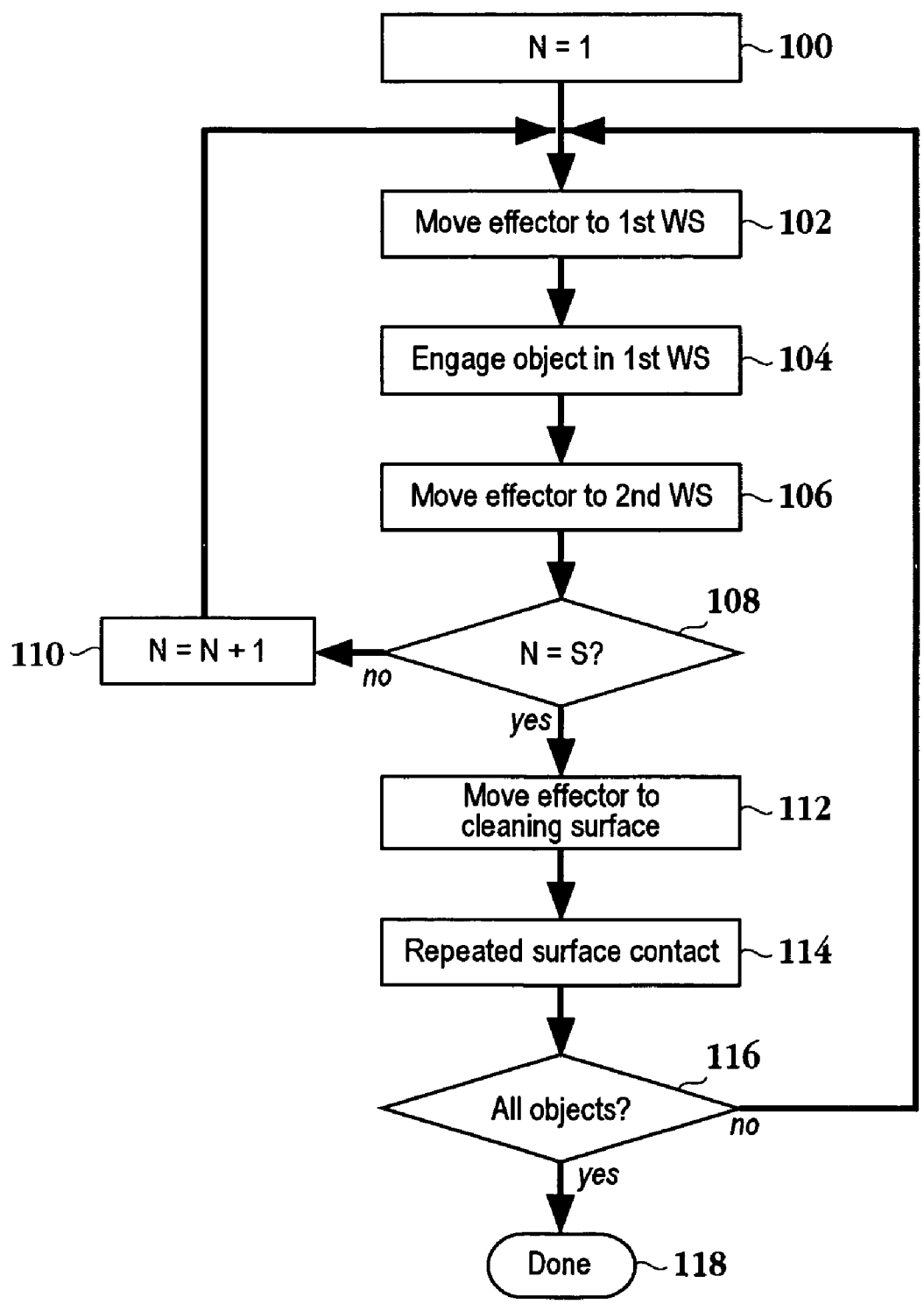
FIG. 9 is a high-level flow diagram showing the operation of the robotics transfer apparatus of FIG. 1 in both transferring objects and self-cleaning.

FIG. 9 is a flow diagram of steps carried out by the control unit in one mode of operation, where the apparatus is programmed to perform a self-cleaning operation every S object transfers, where S may be 1-100 or more transfers. After initializing the unit to N=1 (box 100), the effector is moved to the first workstation (box 102), where it engages an object (box 104). The object is then transferred to the second workstation (box 106) and disengaged. This transfer operation is repeated, through the logic of 108, 110, until the Sth transfer, at which point the effector is moved to the cleaning surface (box 112), and contacted with this surface one or more times (box 114) sufficient to transfer contaminating particles on the effector to the cleaning surface. This entire is repeated, through the logic of 116, until all objects have been transferred (box 118).

The construction of the control unit, including processor and control components, is conventional and easily appreciated from the above description of operation. The apparatus may additional include user input controls for specifying particular transfer operations, and distance and motion variables.

III. Self-Cleaning Transport Method

In another aspect, the invention includes a method for transferring an object, typically as part of a micro- or nano-fabrication process, from one workstation to another, or for manipulating an object within a workstation. In practicing the method, the object to be transferred or manipulated is gripped at one workstation with an end effector composed of an array of nano-scale projections, as described above. The gripped object is moved to the other workstation, or manipulated within the first workstation, and the end effector is then manipulated to release the gripped object. Before, during, or after any of these steps, the end effector is contacted with a cleaning surface having a surface interaction energy with particles carried on the effector as great or greater than the surface interaction energy between particles and effector, thereby to transfer such particles to the cleaning surface. In one embodiment, the method is carried out by a robotic-arm apparatus, such as the apparatus described in the section above. In another embodiment, the end effector may be carried on a tool that can be manipulated by a human user.

In still another embodiment, the end effector is carried on a free-moving particle, such as a magnetic microparticle, whose motion can be controlled by external controller, such as a magnetic driver, for moving objects from one workstation to another in an environment, e.g., a microenvironment containing a plurality of controlled-movement particles, such as described in US patent application A1 U.S. 20020106314, published Aug. 8, 2002, which is incorporated herein by reference. Here the end effector may be formed at a side region of a particle, for particle attachment to objects to be moved or with other particles, for purposes of moving two or more particles in concert. In still another embodiment, this method involves the use of such end effectors in a particle system of this type, for attaching and moving particles through end-effector engagement, independent of the requirement for removing contaminating particles from the end effectors.

The cleaning surface preferably provides a greater area of contact with the unwanted particles than does an end-effector projection, and has a preferred surface roughness of less than about 100 nm $R_{RMS}$. Preferred projection sizes for moving objects within specified size ranges are as detailed in the section above. The step of contacting the end effector with a cleaning surface may be carried out through a single contact, or may require multiple contacts, such as described above, e.g., by vibrating the end effector against the cleaning surface. The object may be removed from the end effector by rotating the end effector to peel the object away from the gripping surface.

IV. Self-Cleaning Adhesive Structures

In still another aspect, the invention includes an adhesive structure capable of (i) adhering to an object having a contact area $A_o$ which is in a defined size range greater than about 5,000 nm$^2$, and (ii) self-cleaning an unwanted particle having a contact area $A_p$ in a defined size range between about 100 and 6400 nm$^2$, and less than about 0.1$A_o$.

Figure 12A:
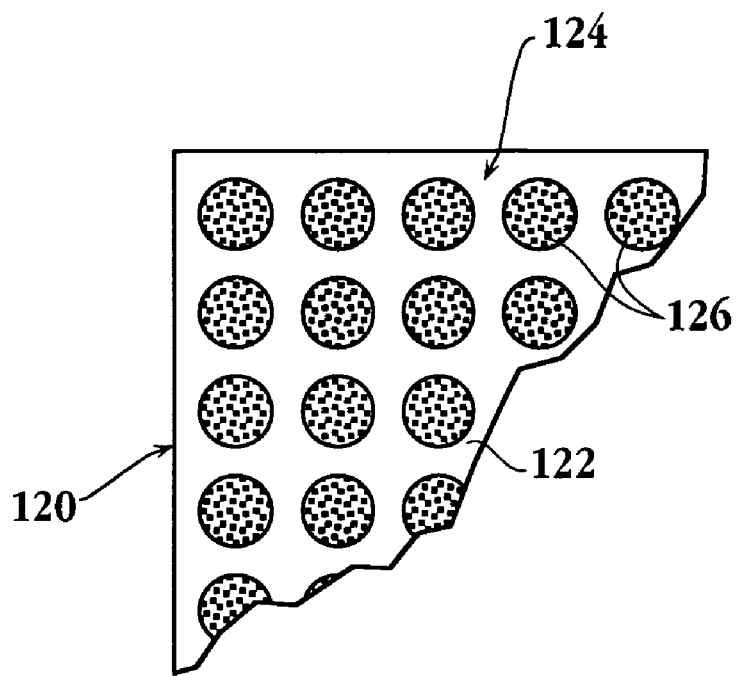
FIGS. 12A and 12B illustrate two different embodiments of adhesives structures constructed in accordance with the invention.
Figure 12B:
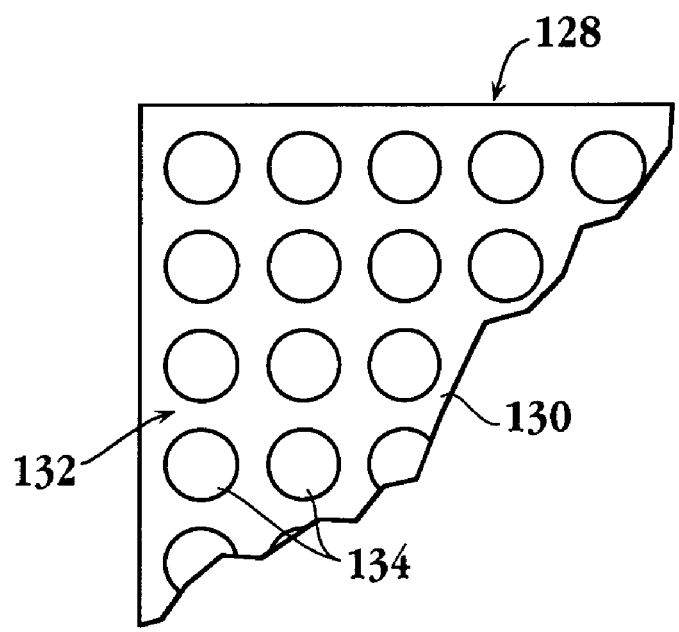

Adhesive structures constructed in accordance with the invention are shown in plan view FIGS. 12A and 12B, and are similar in structure to the end-effector gripping surfaces described above with reference to apparatus 20. Adhesive structure 120 in FIG. 12A is formed of a support or backing 122 having formed thereon, an array 124 of nanoscale projections, such as rounded projections 126. Each projection is formed, as described above, as a single spatula, an array of setae, or an array of individual or groups of spatular structures. The contact ends of the projections have a selected radial dimension R between about 5 and 2,000 nm, and is selected to meet the criterion $A_p \geq 2\pi nm \times R$. In addition, the spacing between adjacent projections is such that an unwanted particle makes contact on average with one projection only, and the object to which the structure is intended to adhere makes contact on average with a plurality of the projections.

Support 122 is preferably formed of a flexible polymer material that is sufficiently flexible to adapt to the object to which the tape is to be adhered. Projections 126 are formed, as described above, to have a surface energy of preferably between 10-40, and most preferably 10-25 mJ/m$^2$. The projections may be formed on a preexisting backing, or the backing and projections may be formed integrally, in either case employing construction methods like those detailed above in Section 2.

Adhesive structure 128 in FIG. 12B is formed of a support or backing 130 having formed thereon, an array 132 of rounded nanoscale projections, such as projections 134. The projections have the same radial dimensions as described for structure 120, are formed simply as rounded "bumps' on the backing, allowing for simply construction using polymer molding or surface treatment techniques.

The adhesive tape or structure of the invention allows for high-force adhesion to objects to be secured by the tape, for example, in securing two or more objects together, or for fastening an object to a surface. The tape can be readily cleaned for reuse simply by contacting the tape surface one or more times against a smooth cleaning surface. The tape may also be used, for example, as a replaceable adhesive material on a robotic or manual gripping end effector, as described above.

In one embodiment, the tape forms one side of a Velcro™-like zipper or fastener, which may have either macro or micro dimensions. The opposite "complement" side is preferably a smooth-surface band that can attach to the tape through the intermolecular forces between each projection and the opposite-side band. Since any particle accumulation on the tape will be transferred to complement band surface, the zipper can be kept free by occasional cleaning of the band surface, in accordance with the invention.

V. Particle-Transfer Device and Method

Because the individual projections in the device of the invention have the capability of gripping small particles, and releasing these particles in a self-cleaning operation, the present invention also has applications in transferring small particles from one site to another, either separately or as spatial arrays of particles.

One such application, for use in a nanofabrication operation, is illustrated in FIGS. 1A-10D. The figures show a transfer head 140 carried at the distal end of a robotic arm 142. The transfer head is formed of a substrate 145 having formed thereon, four fingers 146, 148, 150, and 152 which extend various distances from the substrate and terminate at projections, the latter having the dimensions and construction described in Section II above. In particular, the projections may be formed as spatula, seta, setal arrays, or volumetric projections.

The function of the transfer head is to transfer a plurality of objects, here shown at 156, 158, 160, and 162 from a first workstation 154 and place these objects, in the same spatial relationship, on a structure 164 (FIGS. 10C and 10D) which represents a nano-scale substrate during nanofabrication, by successive addition of objects to the substrate.

In operation, the transfer head is brought into contact with the objects in the workstation, transferring them as a group and in a selected spatial arrangement from station 154 to the transfer head. It will be appreciated from the above the successful transfer operation requires a greater surface interaction force between each object and its corresponding projection than between the same object and the support surface of the workstation. This may be achieved by the relative geometry of the opposite faces of the object and/or by the roughness of the support surface, and/or the materials forming the projections and workstation.

Figure 10A:
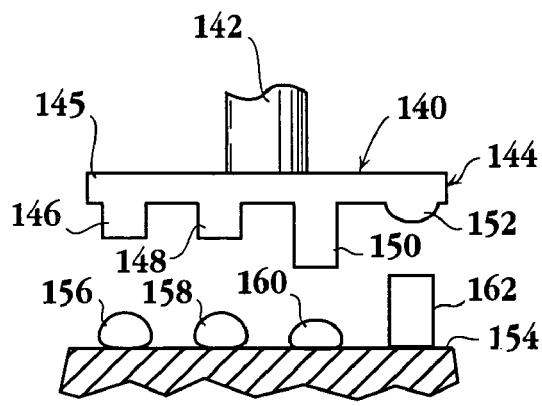
FIGS. 10A-10D illustrate steps in the operation of a nanofabrication apparatus constructed in accordance with the invention for transferring a plurality of nano-objects in a fixed configuration from a workstation to a substrate.
Figure 10B:
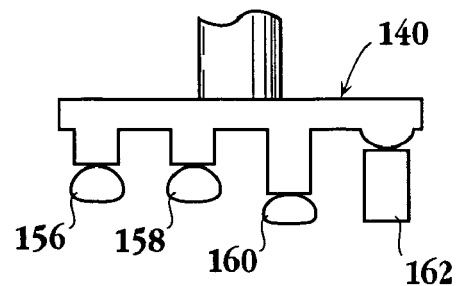
Figure 10C:
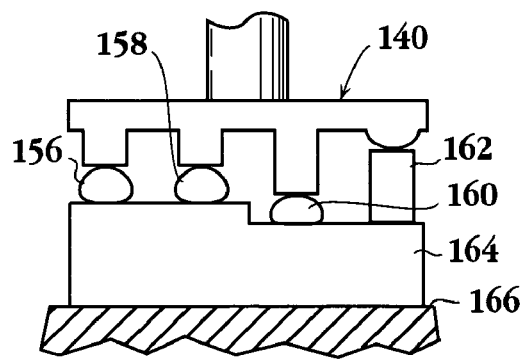
Figure 10D:
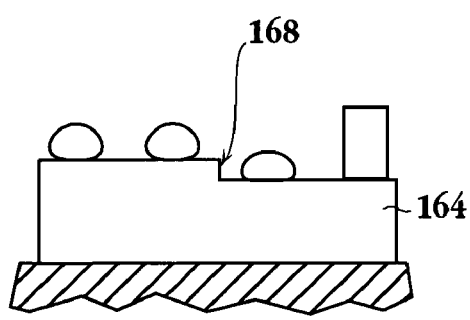

The particles are now transferred (FIG. 10B), from station 154 to a second workstation 166 that supports a structure 164 (FIGS. 10C and 10D) which represents a substrate for a device being constructed (at least at one stage) by addition of one or more particles to the substrate. As seen in FIG. 10C, movement of the transfer head toward the substrate places the four particles in position for transfer to the substrate. Upon contact, the substrate exerts greater surface interaction forces on the particles than do the transfer head projects. As above, this may be achieved by the relative geometry of the faces of the object and/or by the smoothness of the substrate surface, and/or the materials forming the projections and substrate.

The substrate has now been modified by the addition, in a desired spatial arrangement, of four micro- or nano-scale particles. Additional fabrication steps may include further particle addition to the substrate, e.g., employing a different transfer head.

Another application of particle transfer in accordance with the invention is illustrated in FIGS. 11A-11D, for transferring patterns of particles, e.g., visible particles for printing purposes, or beads used for making patterned arrays of beads, e.g., for DNA or protein bead arrays.

Figure 11A:
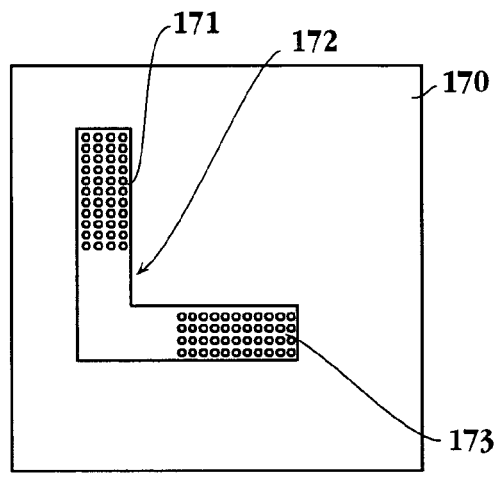
FIGS. 11A-11D illustrate steps in the operation of a printing apparatus constructed in accordance with the invention for transferring print particles from a workstation to a substrate.

FIG. 11A shows a first-station surface 170 from which the particles will be transferred. The figure also shows the end face of a transfer head 172 that is carried on an arm 174 (FIG. 11B) and that will make contact with surface 170. As seen, the transfer head has two arrays of projections, indicated at 171, 173, formed in accordance with the invention. The two arrays form the pattern of particles to be transferred.

Figure 11B:
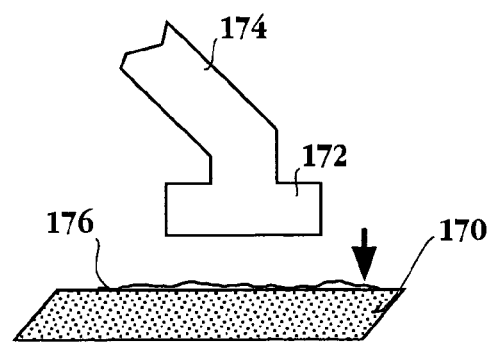
Figure 11C:
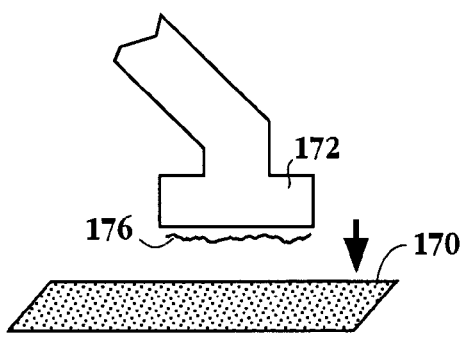
Figure 11D:
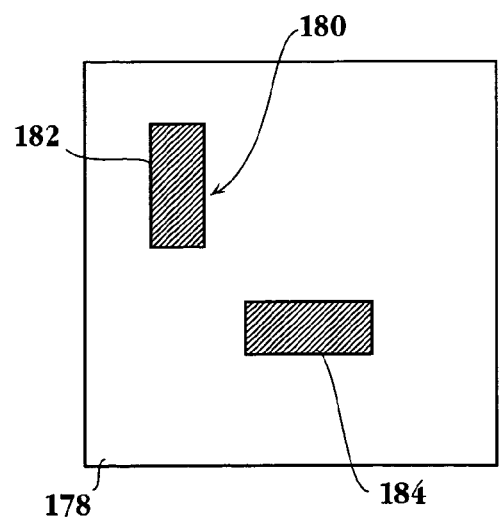

In operation, a layer of particles 176 to be transferred, e.g., ink particles or micro-scale beads, are spread over the pattern area of surface 170 as indicated in FIG. 11B. When the transfer head contacts the layer of particles, the individual projections in arrays 171, 173 will each pick up a particle (or multiple particles if the array projections have surface dimensions substantially larger than the particle dimensions). The same considerations noted above with respect to particle transfer from a surface to a transfer head in the device of FIGS. 10A-10D apply here.

The transfer head is then positioned over a copy surface 180 (FIG. 11C) on which the particles will be deposited when the transfer head is lowered into contact with the surface. With this transfer, the pattern of particles indicated at 180 in FIG. 11D, and consisting of rectangles 182, 184 is formed on surface 178. The process may be repeated as apart of a printing operation, and/or different patterns may be applied to the same receiving surface to form more complex patterns composed of different types of particles.

Although the invention has been described with respect to particular embodiments and applications, it will be appreciated that various changes and modifications may be made without departing from the invention.

It is claimed:

1. A method for transporting an object from one workstation to another or for manipulating an object within a workstation, said method comprising:
    (a) adhesively gripping the object at one workstation with an end effector including an array of nano-scale projections, where each projection provides one or more distal contact ends, the density of the contact ends is such that a surface of the object is gripped with an intermolecular force sufficient to hold the object for movement, and the relative sizes of the object and any unwanted dirt or dust particles that have contaminated the object or a workstation are such that the object makes contact with a greater number of contact ends than contact the unwanted dirt or dust particles,
    (b) moving the end effector such that the gripped object is moved within a workstation or transported to another workstation,
    (c) manipulating the end effector to release the gripped object, and
    (d) before or after any of steps (a)-(c), contacting the end effector with a cleaning surface having a surface energy interaction with the unwanted dirt or dust particles carried on the end effector that is as great or greater than the surface interaction energy between the unwanted dirt or dust particles and the end effector, thereby to transfer the unwanted dirt or dust particles to the cleaning surface.

2. The method of claim 1, wherein said cleaning surface provides a greater area of contact with the unwanted dirt or dust particles than does the end effector.

3. The method of claim 2, wherein the cleaning surface has a surface roughness of less than about 100 nm $R_{RMS}$.

4. The method of claim 1, wherein said contacting includes bringing the end effector into and out of contact with the cleaning surface N times, where N is calculated to effect transfer of an unwanted dirt or dust particle from the end effector to the cleaning surface.

5. The method of claim 4, wherein said contacting includes vibrating the end effector into and out of contact with the cleaning surface for a selected time which is calculated to effect transfer of an unwanted dirt or dust particle from the end effector to the cleaning surface.

6. The method of claim 1, wherein said manipulating includes placing the object on a workstation and rotating the end effector to peel the object away from the gripping surface.

* * * * *